(12) United States Patent
Tohya et al.

(10) Patent No.: US 6,359,237 B1
(45) Date of Patent: Mar. 19, 2002

(54) MULTI-LAYER PRINTED BOARD

(75) Inventors: Hirokazu Tohya; Shiro Yoshida, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/637,684

(22) Filed: Aug. 14, 2000

(30) Foreign Application Priority Data

Aug. 13, 1999 (JP) .............................................. 11-229525

(51) Int. Cl.$^7$ ................................................. H01R 9/09
(52) U.S. Cl. ..................... 174/261; 174/255; 333/12; 333/185; 361/795
(58) Field of Search ................................ 174/255, 256, 174/261; 333/12, 185; 361/794, 795, 750

(56) References Cited

U.S. PATENT DOCUMENTS

| 5,165,055 | A | * | 11/1992 | Metsler ........................ 333/12 |
| 6,002,593 | A | * | 12/1999 | Tohya et al. ................. 333/185 |
| 6,075,211 | A | * | 6/2000 | Tohya et al. ................. 361/795 |
| 6,111,479 | A | * | 8/2000 | Myohga et al. ............. 333/185 |

FOREIGN PATENT DOCUMENTS

| JP | 58-158966 | 9/1983 |
| JP | 63-202090 | 8/1988 |
| JP | 06302960 A | 10/1994 |
| JP | 07022757 A | 1/1995 |
| JP | 7-10979 | 2/1995 |
| JP | 09139573 A | 5/1997 |
| JP | 2724447 | 1/1998 |
| JP | 10-321973 | 12/1998 |
| JP | 11040915 A | 2/1999 |

* cited by examiner

*Primary Examiner*—Albert W. Paladini
(74) *Attorney, Agent, or Firm*—Young & Thompson

(57) ABSTRACT

In order to reduce electromagnetic inductive interference due to power source current, in a multi-layer printed board on which a multiplicity of high-speed and high-frequency circuit elements are mounted, a multi-layer printed board has a construction such that on both upper and lower sides of a power source layer 1 provided with power source wiring 6, are laminated ground layers 2 via respective first insulating material layers 4, and on one or both of the upper and lower sides of these is laminated a signal layer 3 provided with signal wiring, via a second insulating material layer 5.

10 Claims, 8 Drawing Sheets

MULTI-LAYER PRINTED BOARD

BACKGROUND OF THE INVENTION

1. Field of the Invention

The present invention relates to a multi-layer printed board which can reduce electromagnetic inductive interference due to power source current, when a multiplicity of high-speed and high-frequency circuit elements are mounted thereon.

2. Description of the Related Art

It is well known that with multi-layer printed boards on which are mounted high-speed and high-frequency circuit elements such as ICs (Integrated Circuits), LSIs (Large Scale Integrated circuits), that there is a problem in that since electromagnetic noise occurs, electronic equipment mounted on the printed board or other electronic equipment is subjected to EMI (Electro Magnetic Interference), thereby causing malfunction.

Of this EMI, one of particularly great significance is electromagnetic noise resulting from an RF source, caused by a large ground or a ground face used as a reference potential, also referred to as "common mode noise". However, the presumed source of the common mode noise is diversified, and respective source mechanisms are complicated. Hence there has heretofore been no effective method for remedy in the vicinity of the source of release. Therefore, only measures for preventing leakage or radiation of the common mode noise to a cable serving as a main propagation path or as a radiation antenna, have heretofore been taken.

On the other hand, recent research has revealed the fact that one of the largest causes of the common mode noise in high-speed digital circuits is power source current to high-speed and high-frequency circuit elements mounted on a printed board. As an invention developed based on this fact, there is for example, the technique registered by Japanese Patent (Granted) Publication No. 273447 and the technique applied for in Japanese Patent Application, First Publication No. Hei 9-253519.

These technique are for supplying a DC power source with respect to high-speed and high-frequency circuit elements mounted on a printed board by using power source wiring in which an inductance element exhibiting a high impedance at the time of high frequencies, is inserted in the middle of a line. Alternatively this is done by using a power supply line in which characteristic impedance is made high by surrounding the periphery of the line with a magnetic body, as well as connecting a capacitor between the power source of circuit elements and the ground. As a result, while enabling smooth high speed and high frequency operation of circuit elements mounted on the printed board, high frequency power source current generated by the operation is prevented from diffusing over the printed board.

Studies confirming that the electromagnetic radiation level is largely suppressed by applying these techniques to high-performance computers, and that resistant strength (immunity) against electric or electromagnetic disturbance from the outside is improved, are typically published in, for example, "Magnetic body built-in decoupling reinforced multi-layer printed board" (Institute of Electrical Engineers, Magnetics Research Society; 1997–12), "Novel decoupling circuit enabling notable electromagnetic noise suppression and high-density packing in a digital printed circuit board" (IEEE International Symposium on Electromagnetic Compatibility; 1998–8, Denver).

In the above described background art, a line structure wherein an impedance of a DC power supply line of the printed board is made high in a high frequency domain (hereinafter referred to as "decoupling inductor") is adopted, and a capacitor (hereinafter referred to as "bypass capacitor") is used for efficiently splitting the high frequency power source current generated with the high speed and high frequency operation of circuit elements.

Below is a description of an example from Japanese Patent No. 273447, as background art known to have a noticeable EMI suppression effect.

FIG. 5 is a sectional view of a printed board in the prior art, FIG. 6 is a plan view showing a power source layer in the printed board in the prior art, FIG. 7 is a diagram showing an equivalent circuit (decoupling circuit) of a power supply circuit to which the prior art is applied, and FIG. 8 is a diagram for explaining a diffusion suppression effect of a high frequency power source current in a printed board to which the prior art is applied.

The printed board in the prior art comprises, as shown in the sectional view in FIG. 5, a power source layer 101, ground layers 102, signal layers 103, magnetic insulation layers 104 and dielectric insulation layers 105, and in order of from the top to the bottom, there are formed the signal layer 103, the dielectric insulation layer 105, the ground layer 102, the magnetic insulation layer resistant strength, the power source layer 101, the magnetic insulation layer 104, the ground layer 102, the dielectric insulation layer 105, and the signal layer 103.

Here, the magnetic insulation layers 104 comprise an insulating material in which a magnetic body is incorporated, and the dielectric insulation layers 105 comprise an insulating material having only a dielectric property.

Moreover, in the power source layer 101 in a printed board in the prior art, as shown in a plan view of FIG. 6, there are arranged a main wiring 106 and a branch wiring 107 branched from the main wiring 106, and IC/LSIs 108 fitted to a parts face (for example, the surface of the signal layer 103) of the printed board are connected to the point of the branch wiring 107 through a wire hole (not shown), and a decoupling capacitor 109 fitted to a parts face (for example, the surface of the signal layer 103) of the printed board is connected to a connection portion between the branch wiring 107 and the IC/LSIs 108, respectively.

In the printed board of the prior art, as shown in FIG. 7, an equivalent circuit of the power supply circuit for each IC/LSI connects a power source III to an IC/LSI 110 via a power source wiring 112, and connects the IC/LSI 110 and a return circuit of the power source III to a ground layer 113.

At this time, since the magnetic insulation layers 104 are disposed above and below the power source layer, impedance of the power source wiring formed in the power source layer becomes high, becoming equivalent to the case where the decoupling inductor (L) 114 is inserted, as shown in FIG. 7. The inductance 114 and the capacitance (C) 115 of the decoupling capacitor form a low pass filter. Hence, with operation of the IC/LSI 110, the high frequency power source current flowing in the power supply line is suppressed. Moreover, the construction may be such that the decoupling conductor is increased by using an impedance added circuit comprising a meandering portion or the like, for the power source wiring 112.

In this prior art, as seen from the respective figures, with operation of the IC or LSI, the high frequency power source current flowing into the power source layer is blocked by the inductor inserted in the wiring structure, and split by the bypass capacitor disposed in the vicinity of the IC or LSI.

The effect of suppressing diffusion of the high frequency power source current in a printed board to which the prior art shown in FIG. 5 to FIG. 7 is applied is shown in FIG. 8. In FIG. 8, the magnetic field distribution in the vicinity of a substrate is shown, with a stronger magnetic field being a darker color.

With the conventional example shown in FIG. 8(a), since the power source layer is a substrate comprising a flat board over the whole face, the high frequency power source current diffuses over the whole face of the substrate, and electronic equipment being a noise source, is shown in part with a particularly dark color. In the case of Japanese Patent No. 273447 shown in FIG. 8(b), since the power source layer is wired, diffusion of the high frequency power source current decreases, and it is shown that a common mode radiation from the electronic equipment is also suppressed.

This can be considered to be due to diffusion of the high frequency power source current from the IC/LSI being decreased by wiring the power source layer, and a strip line being formed by the power source wiring and the adjacent ground layer, thereby decreasing the electromagnetic coupling between the power source layer (line) and the signal line so that the common mode current decreases.

However, while the technique in the above described Japanese Patent No. 273447 is completely correct from a viewpoint of the conventional decoupling technique, in view of practical use, it has many problems.

A first problem is how to know the high frequency power source current generated with the high speed and high frequency operation. If this is not known, the decoupling inductor and the bypass capacitor cannot be designed. Basically, the circuit design is an operation for setting any two of the circuit voltage, current and impedance to an appropriate value. Particularly in the case of a digital circuit, only two states of "1" and "0" are used as the input/output signals. Therefore, circuit design has been performed by taking notice of the voltage alone, and the current and impedance have not been taken into consideration in the design. Hence, in fact, the characteristics of impedance and current have not been disclosed with respect to most semiconductor ICs and LSIs, ranging from those of worldwide standard to those specified by a customer, and it cannot be expected that these will be disclosed in the near future.

Therefore, methods for measuring the high frequency power source current are proposed not only for the semiconductor manufacturers but also for users, and movement towards global standardization is progressing. However, setting of the operating conditions and setting the measurement environment is relatively difficult. Hence, efficient measurement in the designing line is not easy. Therefore, at present it becomes necessary to estimate the power source current from available characteristic data, instead of the data for the high frequency power source current, allowing for some design error.

A second problem is that basically, parameters of the decoupling inductor and the bypass capacitor must be designed for each semiconductor IC or LSI. For high speed and high frequency operation of semiconductor ICs or LSIs, a circuit for efficiently splitting the high frequency power source current generated with the operation, to the bypass capacitor becomes necessary. It is a fundamental in the circuit design and a matter of course that this circuit is independently designed depending on the type of semiconductor IC or LSI and on changes in the working conditions. As described above however, such design has not heretofore been performed in the digital circuit. Therefore, in the short term the burden on the designer increases, and due to this increasing burden, the design period becomes longer, and design errors also increase. That is to say, in order to apply the decoupling design to a product design, sufficient preparation period becomes necessary for improving design tools, performing retraining of designers and so on.

FIG. 9 shows one example of characteristics of a high frequency power source current of the LSI. To solve the first and second problems described above, characteristics of the high frequency power source current as shown in FIG. 9 must be measured with respect to all ICs and LSIs mounted on a substrate, to determine an electric charge Q being an integral value of a waveform in one cycle, and a necessary capacity of the bypass capacitor must be determined, taking an allowable voltage fluctuation in each IC and LSI into consideration. Moreover, it becomes necessary to calculate a desired inductance value from an impedance ratio of the bypass capacitor to the decoupling inductor, and replace a wiring pattern length, to thereby design the wiring for the power source.

A third problem is that the material technology or manufacturing technology of the decoupling inductor and the bypass capacitor are lagging behind compared to the increase in speed and frequency of semiconductor ICs and LSIs. For example, the switching frequency of a CPU (Central Processing Unit) used for recent personal computers has increased up to about 500 MHz, and when high-speed switching is performed, higher harmonics of several GHz or higher are contained in the power source current of the semiconductor ICs or LSIs constituting the CPU.

However, with the present capacitor manufacturing technology, the resonance frequency of a capacitor having a capacitance of about 0.1 $\mu$F required for the power source of the semiconductor IC or LSI remains within a limit of several tens of MHz. With frequencies higher than this, it will not act as a capacitor, but behaves as an inductor.

In order to operate in higher speed digital circuits in the future, improvement in the high frequency characteristics of the bypass capacitor will be essential. However, in the near future, there is little possibility of a large-capacity small-scale capacitor having a resonance frequency reaching an order of GHz, becoming available in the market. Also, for the decoupling inductor, unless there is progress with research and development on the structure and material, there is little possibility that an inductor having a resonance frequency reaching the GHz mark and an inductance of about several hundreds nH, as well as a current capacity reaching several A, will become available in the market in the near future.

As for the power supply circuit, it is necessary to pursue speed increases in the digital circuit in spite of the various problems as described above. Hence, a substitute measure which is considered relatively easy to put to practical use is required, at least for he time being.

SUMMARY OF THE INVENTION

In view of the above situation, it is a first object of the present invention to provide a multi-layer printed board having a direct current power source supply line structure which can be adopted even if a value of the high frequency power source current generated with the high speed and high frequency operation of a circuit is not disclosed, and even if the high frequency performance of a decoupling inductor and a bypass capacitor is not sufficient, and which enables the high speed and high frequency operation of a power source for semiconductor ICs and LSIs, without largely depending on the type and working conditions of semiconductor ICs and LSIs.

Moreover, it is a second object of the present invention to provide a multi-layer printed board having a direct current power source supply line structure that can suppress generation of a common mode noise due to high frequency power source current of semiconductor ICs or LSIs.

In order to solve the above problems, a multi-layer printed board according to the first aspect of the present invention comprises laminated ground layers through respective first insulating material layers on both upper and lower sides of a power source layer provided with power source wiring and a laminated signal layer provided with signal wiring through a second insulating material layer on one or both of the upper and lower sides.

According to the second aspect of the present invention, in a multi-layer printed board according to the first aspect, the first insulating material layer is comprised of a thin insulating material.

According to the third aspect of the present invention, in a multi-layer printed board according to the first aspect, the first insulating material layer is comprised of a film having a high dielectric constant.

According to the fourth aspect of the present invention, in a multi-layer printed board according to the first aspect, a ground layer is comprised of a conductive layer in a flat board shape over the whole face which does not include a cutout or independent wiring other than a through-hole and a wire hole.

According to the fifth aspect of the present invention, in a multi-layer printed board according to the first aspect, the power source wiring has either one of wider line width among a line width in which a voltage drop due to circuit current becomes less than a predetermined value and a line width in which the characteristic impedance of said power source wiring becomes less than a predetermined value.

According to the sixth aspect of the present invention, in a multi-layer printed board according to the fifth aspect, the power source wiring is comprised of an independent line structure provided between a direct current power source receiving terminal and each circuit element in the power source layer, and has a length longer than a length obtained by multiplying a wavelength of a high frequency component on the line, contained in the power source current for the circuit element by a value determined depending on termination conditions of the line.

According to the seventh aspect of the present invention, in a multi-layer printed board according to the fifth aspect, the power source wiring is comprised of a line pattern capable of accommodating the longest wiring having a constant width within a constant area.

According to the eighth aspect of the present invention, in a multi-layer printed board according to the seventh aspect, the line pattern is comprised of a meandering wiring.

According to the ninth aspect of the present invention, in a multi-layer printed board according to the fifth aspects, the power source wiring is connected with a capacitor between a connection point with the circuit element and the ground layer, and a capacitor between a direct current power source receiving terminal to which the power source wiring is connected and the ground layer.

According to a tenth aspect of the present invention, in a multi-layer printed board according to the ninth aspect, the power source wiring is terminated on the side of the circuit element, by a capacitor having a low characteristic impedance in the high frequency band of a high frequency component contained in the power source current, and is terminated on the side of the direct current power source receiving terminal, by a capacitor having a low characteristic impedance in the low frequency band of a high frequency component contained in the power source current.

According to the eleventh aspect of the present invention, in a multi-layer printed board according to the fifth aspect, a DC supply cable connecting the direct current power source receiving terminal and an external power source unit has a higher common mode impedance than that of the power source wiring.

According to the twelfth aspect of the present invention, in a multi-layer printed board according to the first aspect, the second insulating material layer is comprised of a glass epoxy resin board.

According to the thirteenth aspect of the present invention, in a multi-layer printed board according to the first aspect, the second insulating material layer comprises a ceramic board.

In this invention, the reason for having a line structure of a low impedance with the power source layer inserted between ground layers is as follows. That is, an ideal form of the direct current power source for a high-speed and high-frequency circuit element such as an IC or LSI mounted on a printed board is that the inner impedance has a sufficiently small value over a wide frequency band and that such a power source is provided for each circuit element such as an IC or LSI. By having this, the high frequency power source current flows smoothly down to ground, with the high speed and high frequency operation of the circuit element such as the IC or LSI. As a result it becomes possible to suppress distortion in the signal waveform, and to eliminate mutual interference between circuit elements such as ICs and LSIs, due to deterioration of the voltage stability.

However, independent installation of a power source for each circuit element increases the number of circuit parts, resulting in an increase in equipment cost, as well as increase in equipment size. Moreover, there is also a problem in that the probability of failure of the equipment increases. Hence this is not always practical. Therefore, in the case of relatively small-scale electronic equipment, power sources having the same voltage are often combined into one, so far as there is no special need. That is to say, the direct current power source for the printed boards normally generates power in a unit independent of the printed board, and supplies power via an electric cable, with no consideration being given to the influence of high frequencies.

Therefore, it becomes necessary to arrange elements within the printed board, such that the direct current power source supplied in such a form to the printed board can be supplied to ICs and LSIs in a form close to the above described ideal form.

In order to distribute the direct current in a form close to the ideal form, two methods are considered One is a concept for decreasing the impedance of the power source as much as possible, while giving priority to independent installation of a direct current power source. The method for forming an impedance added circuit in the conventional power source layer (for example, see Japanese Patent Application, First Publication No. Hei 8-137904) is included in this. The other concept is for maintaining independence of the power source as much as possible, while giving priority to decreasing the impedance of the power source. The present invention is based on this latter concept.

According to the construction of the present invention, by constructing a multi-layer printed board in the above described manner, an ideal direct current power source can be supplied independently in appearance to circuit elements such as ICs and LSIs mounted on the printed board. Hence, constraint factors with respect to the high speed operation of the circuit elements such as ICs and LSIs due to the power source section can be eliminated, as well as enabling suppression of electromagnetic coupling between the power source supply line and the signal line on the printed board where high frequency current is flowing, and flow out of the high frequency current from the power source supply line of the printed board to the power source supply cable in the apparatus.

As a result, high speed and high frequency operation of the circuit element such as ICs and LSIs mounted on the printed board can be ensured, electromagnetic radiation from high-speed and high-frequency electronic equipment such as digital equipment and the like is suppressed, and resistant strength against electric or electromagnetic disturbance from the outside can be improved.

DETAILED DESCRIPTION OF THE INVENTION

Hereinafter, an embodiment of the present invention is described with reference to the attached drawings. Description is given specifically by way of examples.

Figure 1:
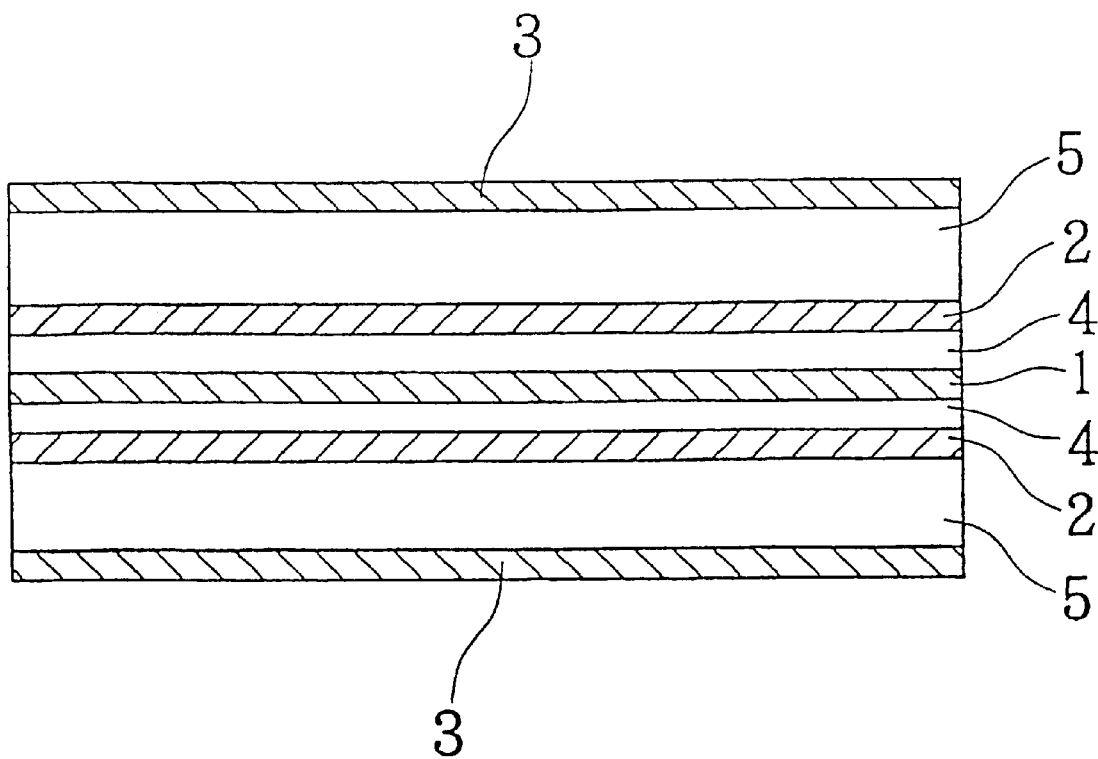
FIG. 1 is a sectional view showing a structure of a multi-layer printed board, being one embodiment of the present invention.
Figure 2:
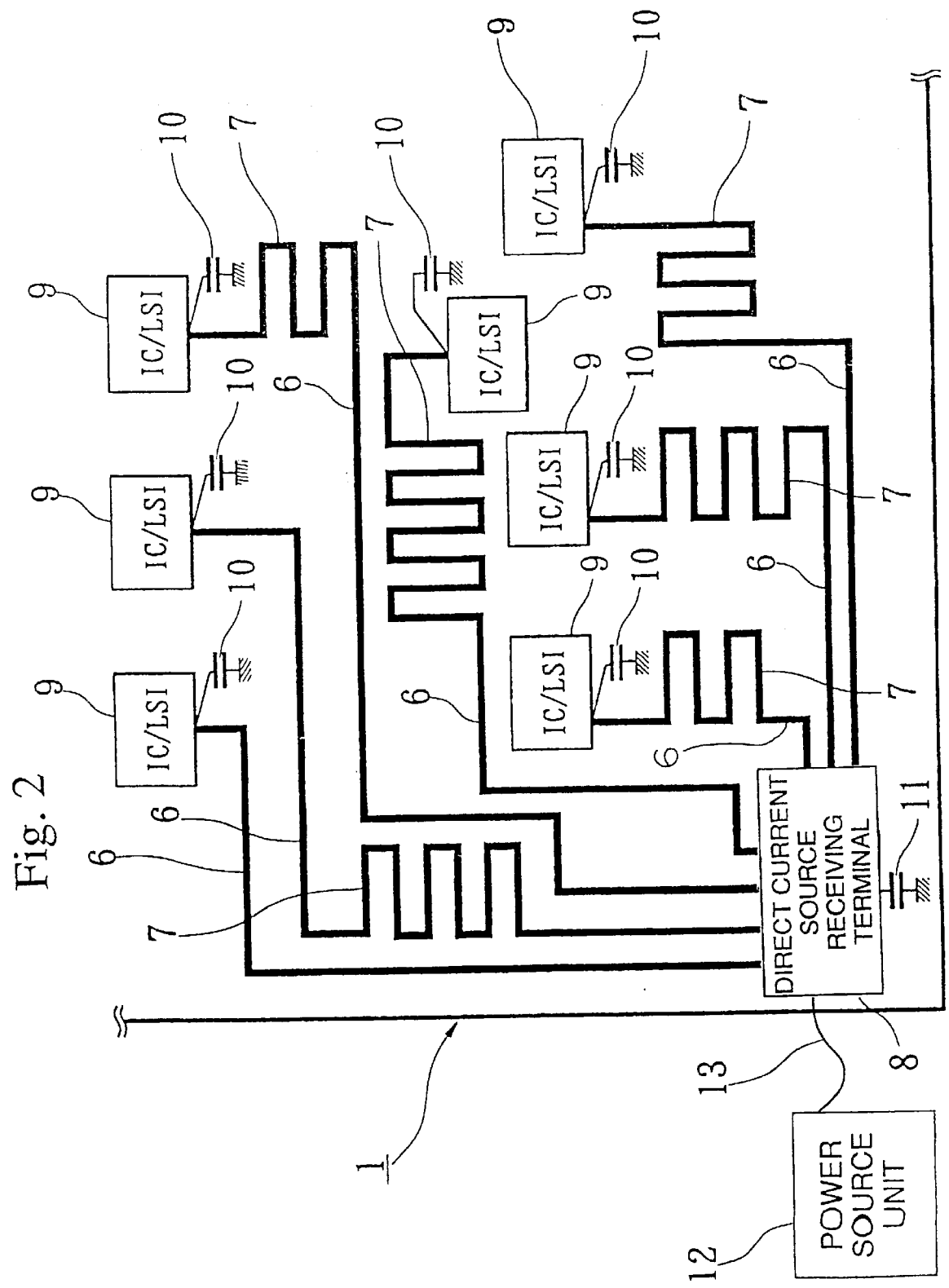
FIG. 2 is a plan view showing a configuration of a power source layer in a printed board, being one embodiment of the present invention.
Figure 3:
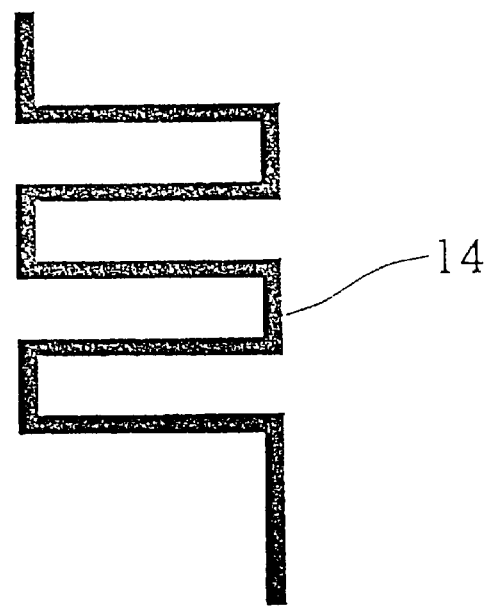
FIG. 3 is a diagram showing an example of a meandering wiring.
Figure 4:
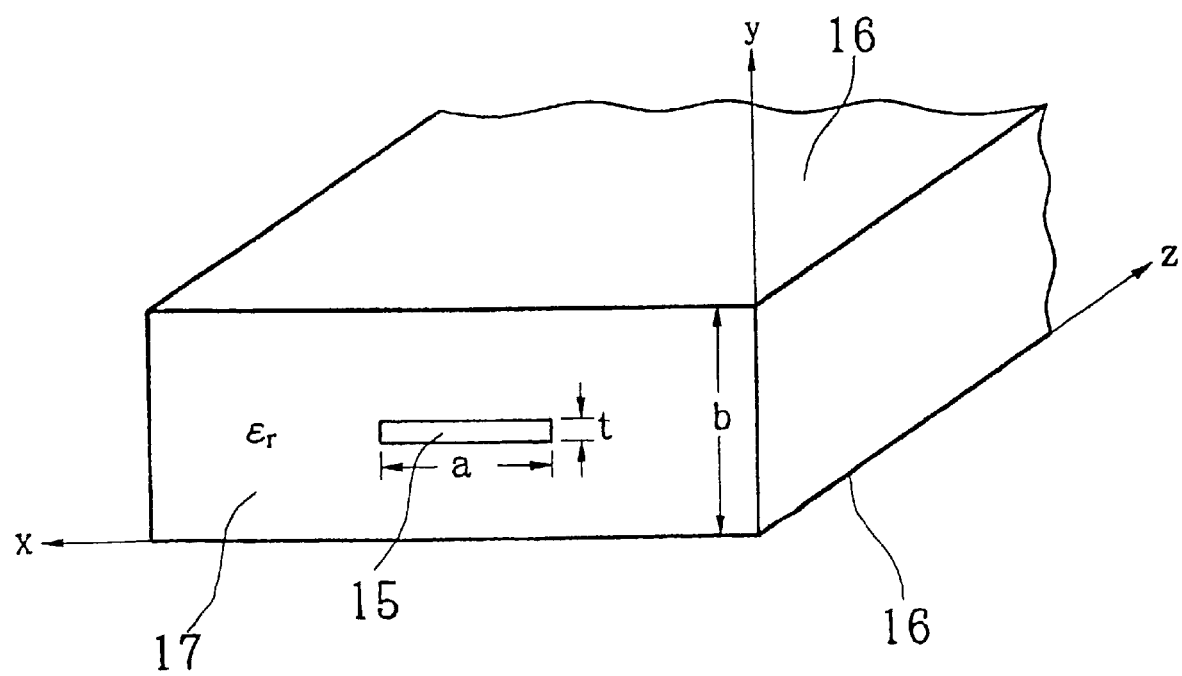
FIG. 4 is a diagram for explaining a strip line structure.
Figure 5:
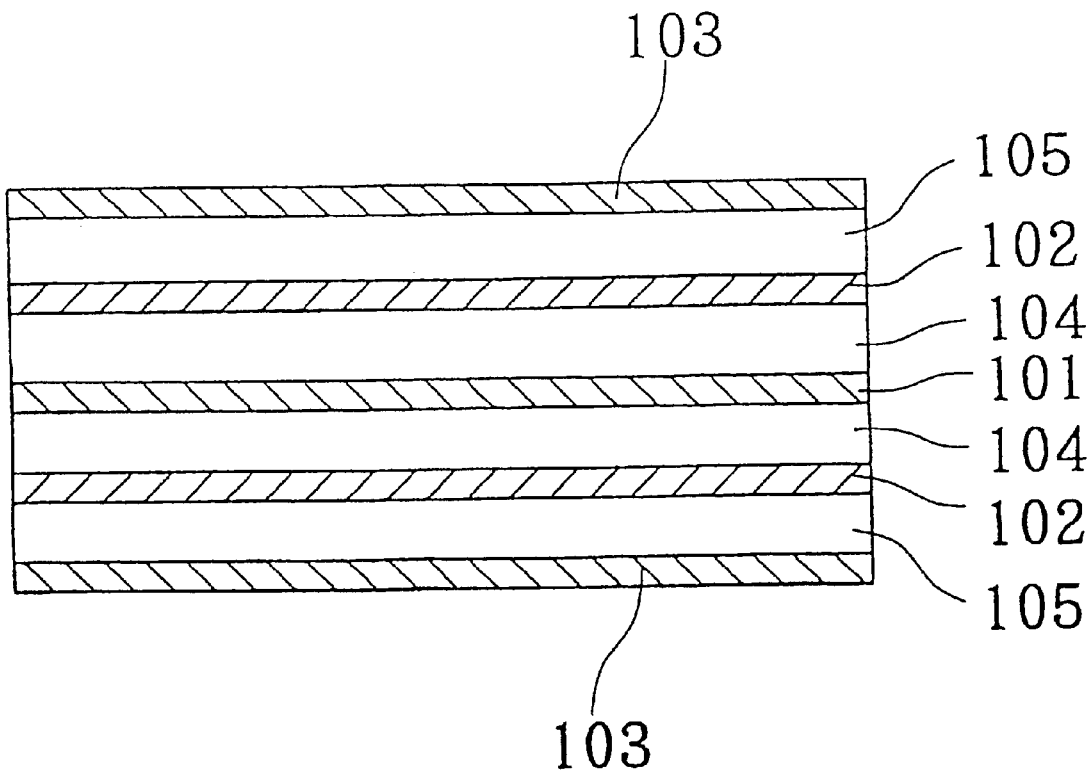
FIG. 5 is a sectional view of a printed board in the prior art
Figure 6:
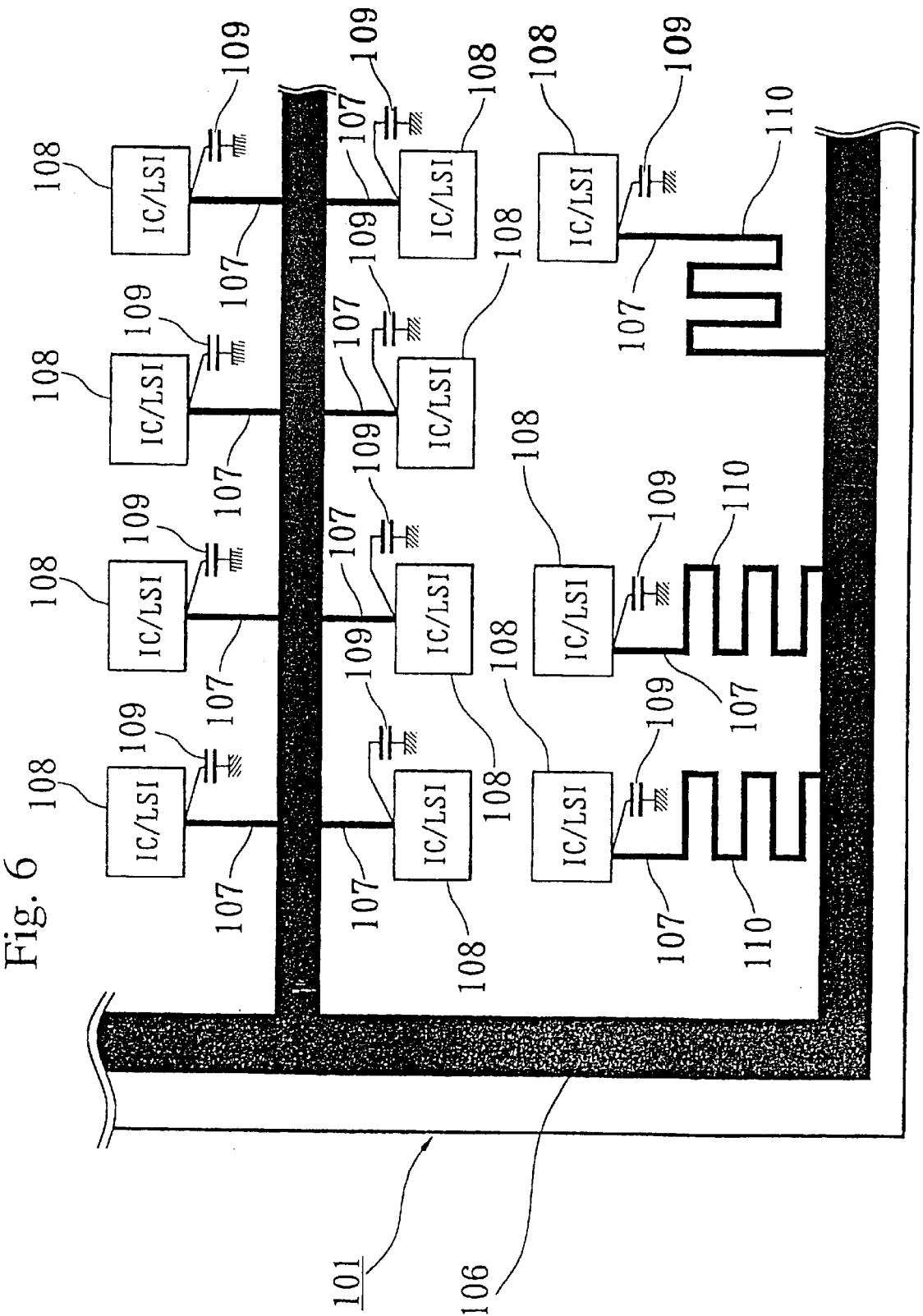
FIG. 6 is a plan view showing a power source layer in a printed board in the prior art.
Figure 7:
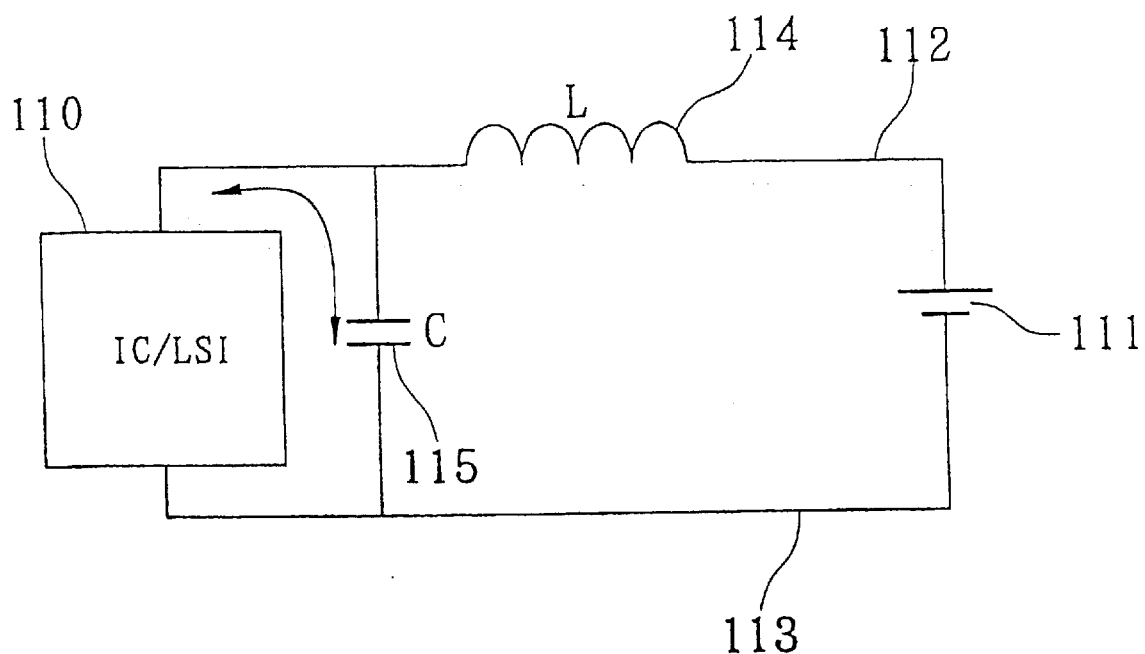
FIG. 7 is a diagram showing an equivalent circuit (decoupling circuit) of a power supply circuit to which the prior art is applied.
Figure 8A:
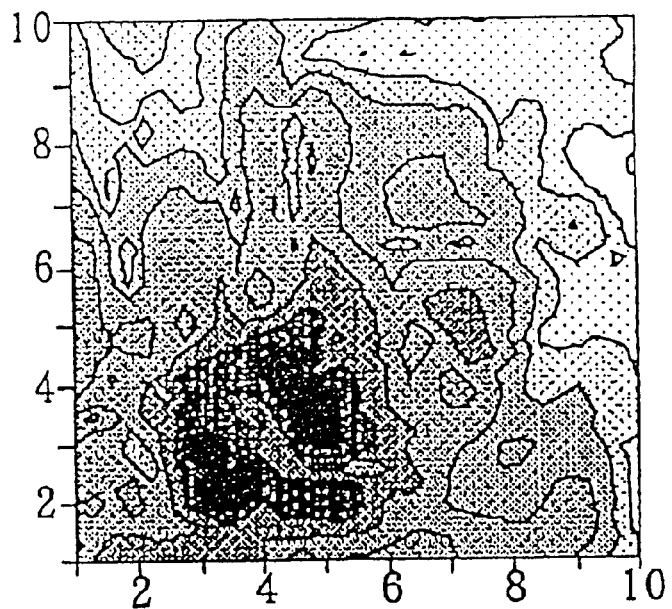
FIGS. 8A and 8B are diagrams for explaining a diffusion suppression effect of a high frequency power source current in a printed board to which the prior art is applied.
Figure 8B:
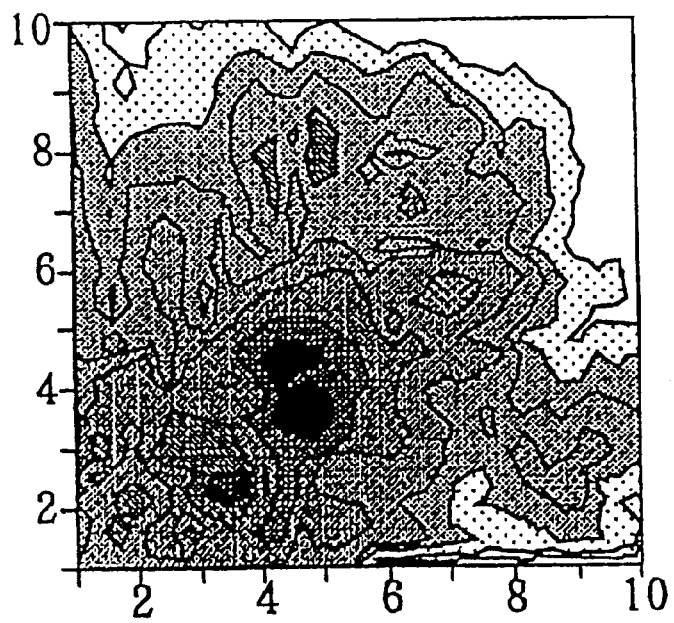
Figure 9:
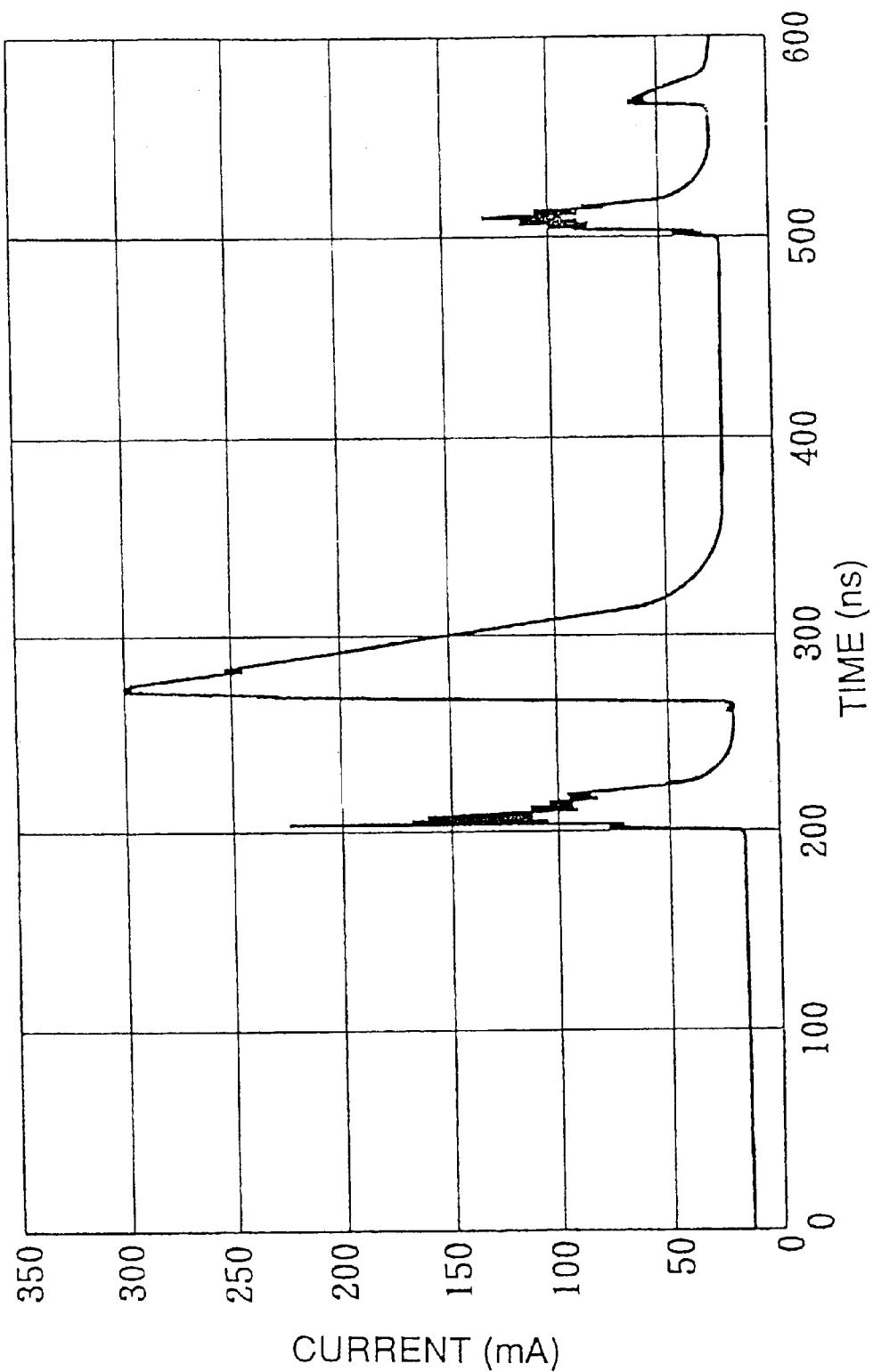
FIG. 9 is a diagram showing one example of high frequency power source current characteristics of an LSI.

FIG. 1 is a sectional view showing a structure of a multi-layer printed board being one embodiment of the present invention, FIG. 2 is a plan view showing a configuration of a power source layer in the printed board being one embodiment of the present invention, FIG. 3 is a diagram showing an example of a meandering wiring, and FIG. 4 is a diagram for explaining a strip line structure.

As shown in FIG. 1, the multi-layer printed board in this example comprises a power source layer 1, ground layers 2, signal layers 3, power source insulating material layers 4 and substrate insulating material layers 5.

In this example, in order from the top to the bottom, there are formed the signal layer 3, the substrate insulating material layer 5, the ground layer 2, the power source insulating material layer 4, the power source layer 1, the power source insulating material layer 4, the ground layer 2, the substrate insulating material layer 5, and the signal layer 3. However, the construction may be such that either one of signal layers 3 and substrate insulating materials 5 are lacking.

The power source layer 1 is a layer in which power source wiring from a direct current power source receiving terminal to each circuit element, is formed by a copper foil pattern. The ground layer 2 is a layer for grounding, formed of a copper foil, and is desirably a flat board over the whole face without including cutouts other than through-holes and wire holes, or independent wiring. The signal layer 3 is a layer in which a signal line is formed for each circuit element by means of a copper foil.

The power source insulating material layer 4 is an insulating material layer for insulating between the power source layer 1 and the ground layer 2, and is formed from a sufficiently thin insulating material having a high dielectric constant. The substrate insulating material layer 5 constitutes a substrate layer of the printed board and is an insulating material layer for insulating between the signal layer 3 and the ground layer 2.

The power source layer 1 in this example comprises, as shown in FIG. 2, power source wiring 6, meandering wiring 7 and a direct current power source receiving terminal 8.

Each power source wiring 6 comprises a copper foil pattern, and is connected at one end to IC/LSIs 9 mounted on a parts face (for example, a surface of the signal layer 3) of a printed board, via a through-hole or a wire hole (not shown), and at the other end to the direct current power source receiving terminal 8. There are cases where a meandering wiring 7 is provided in a part of the power source winding 6.

Bypass capacitors 10 fitted to a parts face (for example, the surface of the signal layer 3) of the printed board, via a through-hole or a wire hole (not shown) are respectively connected to a connection portion between the power source wiring 6 and the IC/LSI 9. Moreover, a termination capacitor 11 fitted to a parts face (for example, the surface of the signal layer 3) of the printed board, via a through-hole or a wire hole (not shown) is connected to the direct current power source receiving terminal 8.

To the direct current power source receiving terminal 8 is connected a power source unit 12 disposed externally, via a direct current supply cable 13.

For the power source wiring 6, there is used a line pattern which can accommodate the longest wiring having a constant width within a constant area. As an example of such a line pattern, there can be mentioned for example a meandering wiring 14, that is, a line pattern formed in a zigzag form as shown in FIG. 3. This line pattern an make the line length effectively longer than a linear wiring pattern simply connecting two points.

The characteristic impedance of the power source wiring becomes lower, as the line width increases, as the spacing between the line and the ground layer becomes narrower, and as the dielectric constant of the insulating material between the line and the ground layer becomes higher. The lowest limit of the frequency for ensuring the characteristic impedance of the power source wiring, decreases in proportion to the line length. Moreover, the upper limit of the frequency capable of ensuring the characteristic impedance of the power source wiring to some degree can be expected to reach several GHz in a printed board using a normal glass fiber reinforced epoxy material. Hence it is possible to form a line having a low impedance in a high frequency domain higher than a certain level. In addition, the shape of the power source wiring is not limited to the meandering wiring shown in FIG. 3, and any shape may be used, so long as the wiring method makes the length longer than that of a simple linear wiring connecting two points.

When a power source layer is designed, designing can be advanced by a relatively simple operation such as determining the spacing between the line and the ground layer and the dielectric constant of the insulating material at the time of designing the material for a printed board, then freely classifying semiconductor ICs and LSIs mounted on the printed board based on the power consumption, to determine the line width of the power source wiring for respective groups, and then designing the wiring in accordance with an appropriate rule and selecting a bypass capacitor for each semiconductor IC and LSI according to the result.

With regard to the selection of the bypass capacitor, since the power source wiring ensures impedance in the high frequency band, the degree of freedom for the selection is high. Hence it can be considered that cost increase and design error are unlikely to occur.

In this example, the characteristic impedance of the power source wiring is decreased in a wide range high frequency band, by thinning the power source insulating material layer 4 between the power source layer 1 and the ground layer 2, while increasing the width of the power source wiring to some degree. The characteristic impedance of the power source wiring in this case can be determined by assuming the power source wiring as a strip line as shown in FIG. 4, wherein the power source wiring is a strip conductor 15, the ground layer is upper and lower grounding conductors 16, and the power source insulating material layer is a ground insulating material 17.

The characteristic impedance ($Z_0$) of the strip line can be easily determined by applying the well known simplified equation given below.

$$Z_0 = \frac{94.15}{\sqrt{\varepsilon_r}\left\{\frac{a}{(b-t)} + 0.45 + 1.18\frac{t}{b}\right\}} \quad (1)$$

where t; thickness of the strip conductor
a; width of the strip conductor
b ; thickness of the ground insulating material provided that $0.05 < t/b < 0.5$
$\varepsilon_r$; specific dielectric constant (effective dielectric constant $\varepsilon_{eff}$) of an insulating material on either side of the strip conductor.

As a means for decreasing the characteristic impedance of the power source wiring, an insulating material layer comprising a thin film or a thick film dielectric formed by, for example, a printing (painting) method, may be used for decreasing the thickness of the power source insulating material layer 4.

Moreover, in this example, the characteristic impedance can be further decreased, by increasing the dielectric constant of the insulating material forming the power source insulating material layer 4. Specifically, for example, the multi-layer printed board can be formed by inserting the power source wiring between insulating films comprising a high dielectric material, and laminating a ground layer on both sides thereof.

In this manner, in the case of the same wiring width, a multi-layer substrate structure is first determined such that the characteristic impedance of the power source wiring becomes as low as possible, and then the minimum wiring width is determined from the standpoint of allowable current for each group of circuit elements such as ICs and LSIs mounted on the printed board, grouped by power consumption.

Another condition for determining the wiring width is the value of the characteristic impedance. This is also grouped by power consumption, to determine the minimum wiring width based on equation (1).

Actually, either of the wiring widths determined in this manner which has a wider width may be adopted.

A minimum frequency for ensuring the characteristic impedance value, is specified according to the line length of the power source wiring. Specifically, when the line length is longer than ¼ or ½ of the wavelength for which the wavelength shortening effect by means of the dielectric can be expected, the characteristic impedance can be substantially ensured. Which of the ¼ or ½ of the wavelength is chosen depends on the termination condition (open or short) of the line. In the case of FIG. 1, both ends of the power supply line are terminated by capacitors having sufficiently low impedance (for example, about 0.1 ohm). Hence the line length in this case becomes ½ of the wavelength.

A capacitor used for the power source wiring on the side of the circuit elements such as ICs and LSIs, terminates the power supply line in a relatively high frequency domain (for example, from 30 MHz to 100 MHz), and a capacitor used for the power source wiring on the side of the direct current power source receiving terminal 8 of the printed board, terminates the power supply line in a relatively low frequency domain (for example, from 150 KHz to 30 MHz). As a result, the high frequency power source current accompanying the high speed and high frequency operation of semiconductor ICs and LSIs can be smoothly split into the bypass capacitor and the power source wiring on these circuit elements side, and the power source current in a wide frequency band ranging from the high frequency domain to the low frequency domain of the power source wiring can be suppressed from flowing into the direct current power source receiving terminal 8 which supplies direct current to the printed board.

Moreover, in order to make it difficult for the high frequency current to leak from the direct current power source receiving terminal 8 of the printed board, to the direct current supply cable 13, it is desirable to sufficiently increase (for example, to more than several tens of ohms) the common mode impedance of the direct current supply cable 13.

An embodiment of the present invention has been described above in detail with reference to drawings. However, the practical structure is not limited to this embodiment, and modifications made in the design without departing from the gist of the present invention are included in the present invention. For example, as an insulating material constituting the substrate insulating material layer 5, a glass epoxy resin plate may be used, or a ceramic plate may be used. The thin film dielectric forming the power source insulating material layer 4 may be formed by vapor deposition, and the thick film dielectric may be formed by spattering.

As described above, according to the present invention, a direct current power source can be supplied to circuit elements such as semiconductor ICs and LSIs mounted on a multi-layer printed board, in a state similar to the case where an independent power source having low impedance is provided independently, and electromagnetic radiation from high-speed and high-frequency electronic equipment such as digital equipment can be suppressed without hindering high speed and high frequency operation of the circuit elements such as ICs and LSIs mounted on the printed board, thereby enabling an improvement in resistant strength against electric or electromagnetic disturbance from the outside.

What is claimed is:

1. A multi-layer printed board comprising:
a power source layer comprising power source wiring;
first insulating material layers disposed on opposite sides of the power source layer;
a ground layer disposed on each of the first insulating material layers opposite the power source layer;
a second insulating material layer arranged on at least one of the ground layers;
at least one signal layer arranged on the second insulating layer;
a direct current source receiving terminal connected to the power source layer, and adapted to receive power from a power source unit;
a plurality of integrated circuit devices arranged on the at least one signal layer;
wherein each of the integrated circuit devices is electrically connected to the direct current source receiving terminal by an entirely separate power source wiring line in the power source layer.

2. A multi-layer printed board according to claim 1, wherein each said power source wiring line has a line width which is a wider line width selected from a line width in which a voltage drop due to circuit current flow between the direct current source receiving terminal and each said integrated circuit device becomes less than a predetermined voltage drop value and a line width in which a characteristic impedance of said power source wiring line becomes less than a predetermined characteristic impedance value.

3. A multi-layer printed board according to claim 2, wherein each of the wiring lines has a length longer than a length obtained by multiplying a wavelength of a high frequency component of current on said wiring line by a value determined depending on termination conditions of said wiring line.

4. A multi-layer printed board according to claim 2, wherein each of said power source wiring lines has a same constant width.

5. A multi-layer printed board according to claim 4, wherein at least one of said wiring lines comprises a meandering wiring.

6. A multi-layer printed board according to claim 2, wherein each of said power source wiring lines is connected with a first capacitor between a connection point with a respective said integrated circuit device and the ground layer, and a second capacitor between the direct current power source receiving terminal and the ground layer.

7. A multi-layer printed board according to claim 6, wherein each said first capacitor has a low characteristic impedance in a high frequency band of a high frequency component contained in the power source current, and each said second capacitor has a low characteristic impedance in a low frequency band of a high frequency component contained in said power source current.

8. A multi-layer printed board according to claim 2, further comprising a DC supply cable connecting said direct current power source receiving terminal to the external power source unit, the DC supply cable having a higher common mode impedance than that of said power source wiring lines.

9. A multi-layer printed board according to claim 1, wherein said second insulating material layer is comprised of a glass epoxy resin board.

10. A multi-layer printed board according to claim 1, wherein said second insulating material layer is comprised of a ceramic board.

* * * * *